United States Patent
Hwang et al.

(10) Patent No.: US 7,486,122 B1
(45) Date of Patent: Feb. 3, 2009

(54) DIGITIZED METHOD FOR GENERATING PULSE WIDTH MODULATION SIGNALS

(75) Inventors: Jonq-Chin Hwang, Taipei (TW); Sheng-Nian Yeh, Taipei (TW); Li-Hsiu Chen, Pingtung County (TW)

(73) Assignee: National Taiwan University of Science and Technology, Taipei (TW)

( * ) Notice: Subject to any disclaimer, the term of this patent is extended or adjusted under 35 U.S.C. 154(b) by 0 days.

(21) Appl. No.: 11/839,308

(22) Filed: Aug. 15, 2007

(30) Foreign Application Priority Data

Jul. 11, 2007 (TW) .............................. 96125243 A

(51) Int. Cl.
*H03K 3/017* (2006.01)
(52) U.S. Cl. ................. 327/175; 327/172; 327/176
(58) Field of Classification Search ............. 327/164, 327/172, 175, 176; 375/238
See application file for complete search history.

(56) References Cited

U.S. PATENT DOCUMENTS

| 6,218,815 | B1 | 4/2001 | Kates et al. |
| 6,366,069 | B1 | 4/2002 | Nguyen et al. |
| 6,628,106 | B1 | 9/2003 | Batarseh et al. |
| 7,002,325 | B2 | 2/2006 | Harris et al. |
| 2008/0143408 | A1 * | 6/2008 | Paillet et al. ................. 327/175 |

* cited by examiner

*Primary Examiner*—Long Nguyen
(74) *Attorney, Agent, or Firm*—J.C. Patents

(57) ABSTRACT

A digitized method for generating pulse width modulation (PWM) signals is disclosed. In the digitized method, multiphase PWM signals are generated by altering the reference levels so that fully on duty cycle or fully off duty cycle of each phase PWM signal can be achieved. Therefore, the digitized PWM signal generation method in the present invention can be applied to any application apparatus having boost/buck converter.

5 Claims, 4 Drawing Sheets

DIGITIZED METHOD FOR GENERATING PULSE WIDTH MODULATION SIGNALS

CROSS-REFERENCE TO RELATED APPLICATION

This application claims the priority benefit of Taiwan application serial no. 96125243, filed on Jul. 11, 2007. All disclosure of the Taiwan application is incorporated herein by reference.

BACKGROUND OF THE INVENTION

1. Field of the Invention

The present invention generally relates to a method for generating multiphase pulse width modulation (PWM) signals, in particular, to a digitized method for generating multiphase PWM signals.

2. Description of Related Art

The arithmetic logic unit (ALU) in an earlier central processing unit (CPU) does not perform any complicated logic calculation therefore it does not consume much power and has long response time. Accordingly, the core voltage ($V_{DD\_CORE}$) required by an earlier CPU is usually generated by driving a buck converter through single-phase pulse width modulation (PWM) and then filtering the power supply output by the buck converter. However, the logic calculations executed by the ALUs of today's CPUs have become very complicated; thus, the conventional method for generating CPU core voltage through single-phase PWM has become outdated. Accordingly, a multiphase PWM method is provided, wherein a plurality of buck converters connected to each other in parallel are sequentially driven so that a stable power supply can be provided to a CPU.

As described above, how to turn on a plurality of buck converters, which are connected to each other in parallel, one by one is a major subject of the multiphase PWM method. Generally speaking, a plurality of saw-toothed waves is provided, and the saw-toothed waves are respectively compared with a reference level through phase split so as to generate a plurality of split phase PWM signals. After that, the buck converters connected to each other in parallel are turned on one by one by using these split phase PWM signals. Below, a conventional method for generating three-phase PWM signals will be described as an example of the conventional technique for generating a plurality of split phase PWM signals.

FIG. 1 illustrates a conventional method for generating three-phase PWM signals. Referring to FIG. 1, the duty cycles of the three-phase PWM signals (d)~(f) are all 50% on and 50% off. In order to generate these three-phase PWM signals (d)~(f), first, three sawtooth signals (a)~(c) are provided. The sawtooth signals (a)~(c) are respectively generated by a triangle wave generator, and the sawtooth signals (a)~(c) are processed by a RC delay circuit and become three split phase sawtooth signals (a)~(c). The sawtooth signals (a)~(c) have the same switch period $T_{SW}$, and the phase difference between the sawtooth signals (a)~(c) is a third of the switch period $T_{SW}$ ($T_{SW}/3$). In addition, the peak voltage of each of the sawtooth signals (a)~(c) is 1V, and the valley voltage thereof is 0V.

Thereafter, three reference levels $d_1$~$d_3$ are provided and are respectively compared with the sawtooth signals (a)~(c). Here it is assumed that when the reference levels $d_1$~$d_3$ are greater than the sawtooth signals (a)~(c), the state of the PWM signals (d)~(f) is on, and when the reference levels $d_1$~$d_3$ are smaller than the sawtooth signals (a)~(c), the state of the PWM signals (d)~(f) is off. Accordingly, the three-phase PWM signals (d)~(f) are generated based on foregoing assumption.

It has to be mentioned here that the voltage value of foregoing three reference levels $d_1$~$d_3$ has to be determined according to the duty cycles of the PWM signals (d)~(f). In other words, when the duty cycles of the PWM signals (d)~(f) are 50% on and 50% off, the voltage value of the reference levels $d_1$~$d_3$ is 0.5V. In addition, when the duty cycles of the PWM signals (d)~(f) are 70% on and 30% off, the voltage value of the reference levels $d_1$~$d_3$ is 0.7V, and so on. The voltage value of the reference levels $d_1$~$d_3$ can be changed according to the actual requirement, so that the desired multiphase PWM signals can be generated, and accordingly the buck converters connected to each other in parallel can be turned on sequentially.

As described above, according to a conventional method for generating multiphase PWM signals, a plurality of sawtooth signals are processed by a RC delay circuit so as to generate a plurality of split phase sawtooth signals, and then the split phase sawtooth signals are respectively compared with a reference level to generate the multiphase PWM signals. In other words, in the conventional technique, a plurality of split phase sawtooth signals is provided through a phase delay concept, and the multiphase PWM signals are then generated based on these split phase sawtooth signals. Related techniques are respectively disclosed in U.S. Pat. Nos. 6,628,106, 6,366,069, 6,218,815, and 7,002,325.

However, in all the techniques disclosed in foregoing U.S. patents, the number N of split phases of the PWM signals is restricted, and accordingly, the duty cycle of each phase PWM signal is between 0 and 1/N or between 0 and ½N, wherein N is a positive integer greater than or equal to 3. Thereby, fully on duty cycle cannot be accomplished, and accordingly these techniques can only be applied to buck converters but not in boost converters.

SUMMARY OF THE INVENTION

Accordingly, the present invention is directed to a digitized method for generating pulse width modulation (PWM) signals, wherein multiphase PWM signals are generated through the alteration of reference levels, and the duty cycle of each phase PWM signal is between 0 and 1.

The present invention provides a digitized method for generating N-phase PWM signals, wherein each phase PWM signal has the same duty cycle and the phase difference between the PWM signals is the number of the duty cycle being divided by N or is 0, wherein N is a positive integer greater than or equal to 3.

The digitized PWM signal generation method provided by the present invention includes following steps. First, a plurality of reference levels are provided, wherein the voltage value of each reference level is between a first voltage value and a second voltage value, and these reference levels are used for correspondingly determining the duty cycles of the N-phase PWM signals. Then, a common PWM carrier is provided, wherein the common PWM carrier is a plurality of fixed-cycle sawtooth signals, and the common PWM carrier has N fixed-cycle sawtooth signals during the switch period of each phase PWM signal. After that, a plurality of first (N−1)-step digital staircase signals is provided, wherein the third voltage level state of each step digital staircase in each of the first (N−1)-step digital staircase signals is updated at the reset edge of each fixed-cycle sawtooth signal according to the state of each phase PWM signal.

Thereafter, each of the reference levels is amplified N times and then subtracted from the third voltage level of each step digital staircase in each of the first (N−1)-step digital staircase signals, so as to obtain a plurality of second (N−1)-step digital staircase signals correspondingly. Then, the fourth voltage level state of each step digital staircase in each of the second (N−1)-step digital staircase signals is restricted between the first voltage value and the second voltage value. Finally, the fourth voltage level state of each step digital staircase in each of the second (N−1)-step digital staircase signals is compared with the fifth voltage level of the fixed-cycle sawtooth signal during the switch period of each phase PWM signal, so as to generate the N-phase PWM signals correspondingly.

In the digitized PWM signal generation method provided by the present invention, the multiphase PWM signals are generated by altering the reference levels. Thus, in the present invention, the duty cycle of each phase PWM signal is not restricted by the number of split phases of the PWM signals, and fully one duty cycle or fully off duty cycle can be easily achieved. Accordingly, the digitized PWM signal generation method provided by the present invention can be applied to both buck converter and boost converter according to the actual requirement.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
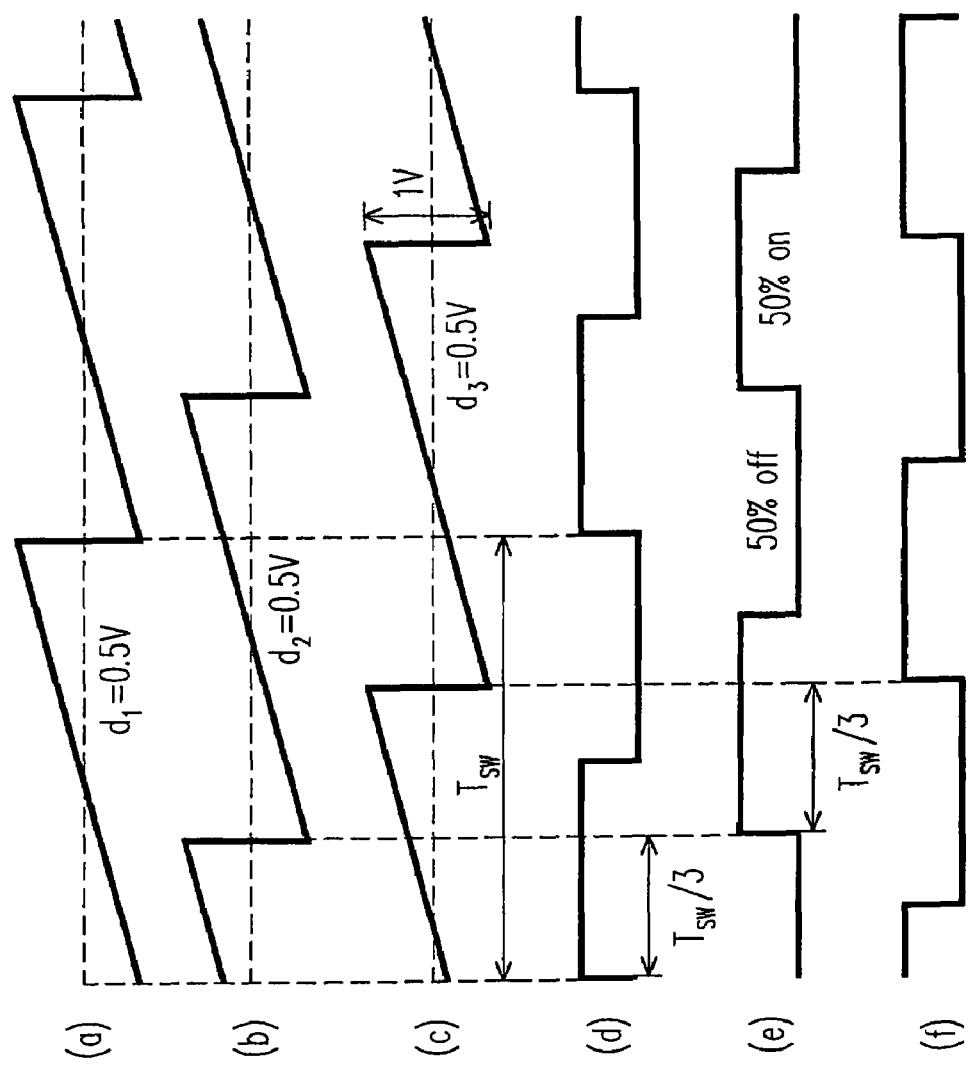
FIG. 1 illustrates a conventional method for generating three-phase PWM signals.

Reference will now be made in detail to the present preferred embodiments of the invention, examples of which are illustrated in the accompanying drawings. Wherever possible, the same reference numbers are used in the drawings and the description to refer to the same or like parts.

In the present invention, multiphase pulse width modulation (PWM) signals are generated and fully on duty cycle and fully off duty cycle of each phase PWM signal can be achieved. Below, features, aspects, and advantages of the present invention will be described in detail with reference to accompanying drawings.

Figure 2:
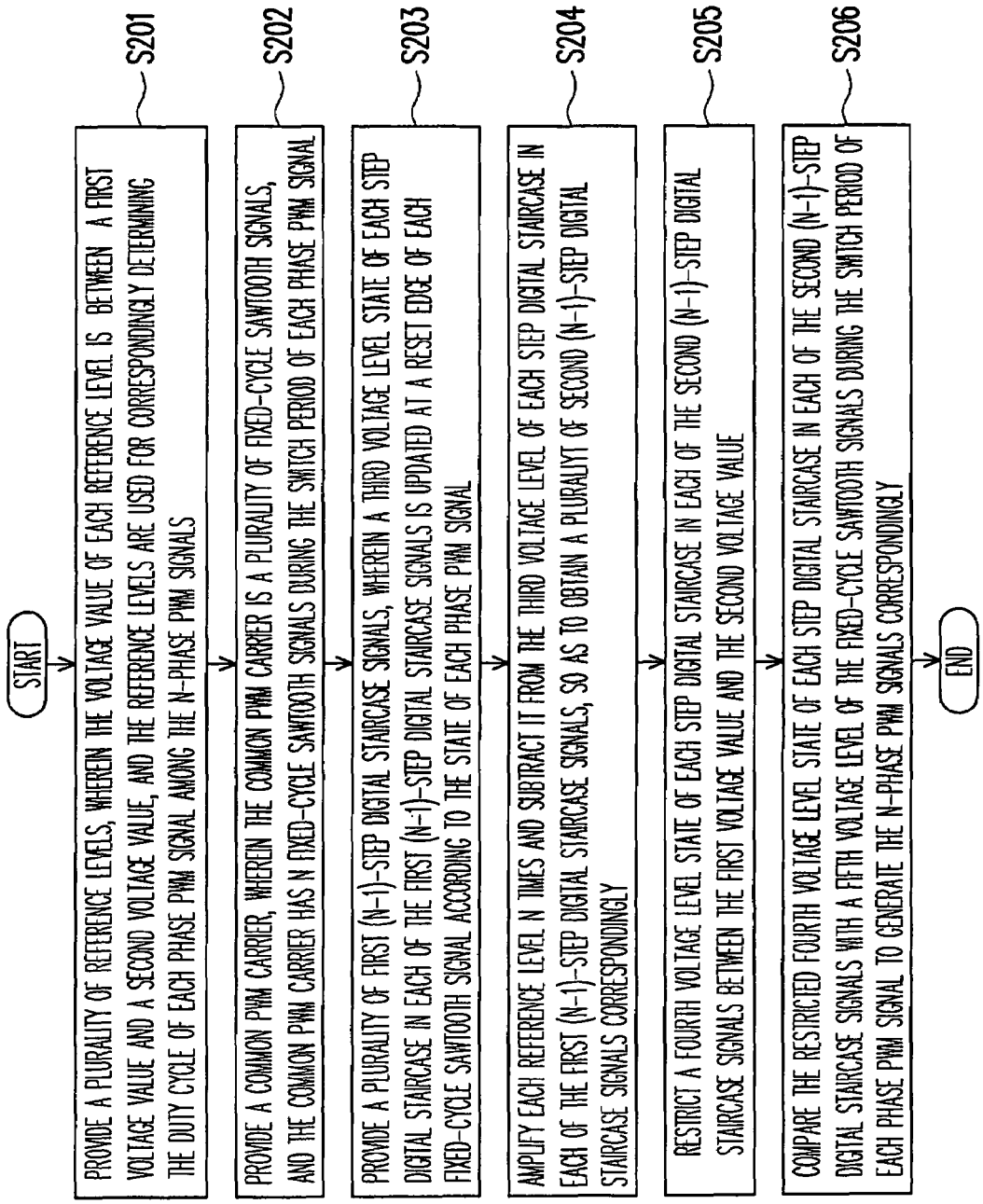
FIG. 2 is a flowchart of a digitized method for generating pulse width modulation (PWM) signals according to an embodiment of the present invention.

FIG. 2 is a flowchart of a digitized method for generating PWM signals according to an embodiment of the present invention. Referring to FIG. 2, in the present embodiment, N-phase PWM signals are generated, and each phase PWM signal has the same switch period, and the phase difference between the PWM signals is a number of the switch period being divided by N or is 0, wherein N is a positive integer greater than or equal to 3.

In the present embodiment, the digitized PWM signal generation method includes following steps. First, in step S201, a plurality of reference levels are provided, wherein the voltage value of each reference level is between a first voltage value and a second voltage value, and the reference levels are used for correspondingly determining the duty cycles of the N-phase PWM signals. Next, in step S202, a common PWM carrier is provided, wherein the common PWM carrier is a plurality of fixed-cycle sawtooth signals (for example, post-edge sawtooth signals or leading-edge sawtooth signals), and the common PWM carrier has N fixed-cycle sawtooth signals during the switch period of each phase PWM signal.

After that, in step S203, a plurality of first (N−1)-step digital staircase signals is provided, wherein a third voltage level state of each step digital staircase in each of the first (N−1)-step digital staircase signals is updated at a reset edge of each fixed-cycle sawtooth signal according to the state of each phase PWM signal. Next, in step S204, each reference level is amplified N times and is subtracted from the third voltage level of each step digital staircase in each of the first (N−1)-step digital staircase signals, so as to obtain a plurality of second (N−1)-step digital staircase signals correspondingly.

Thereafter, in step S205, a fourth voltage level state of each step digital staircase in each of the second (N−1)-step digital staircase signals is restricted between the first voltage value and the second voltage value. Finally, in step S206, the restricted fourth voltage level state of each step digital staircase in each of the second (N−1)-step digital staircase signals is compared with a fifth voltage level of the fixed-cycle sawtooth signals during the switch period of each phase PWM signal to generate the N-phase PWM signals correspondingly.

A hardware infrastructure diagram and a simulation diagram for implementing foregoing digitized PWM signal generation method will be described below.

Figure 3:
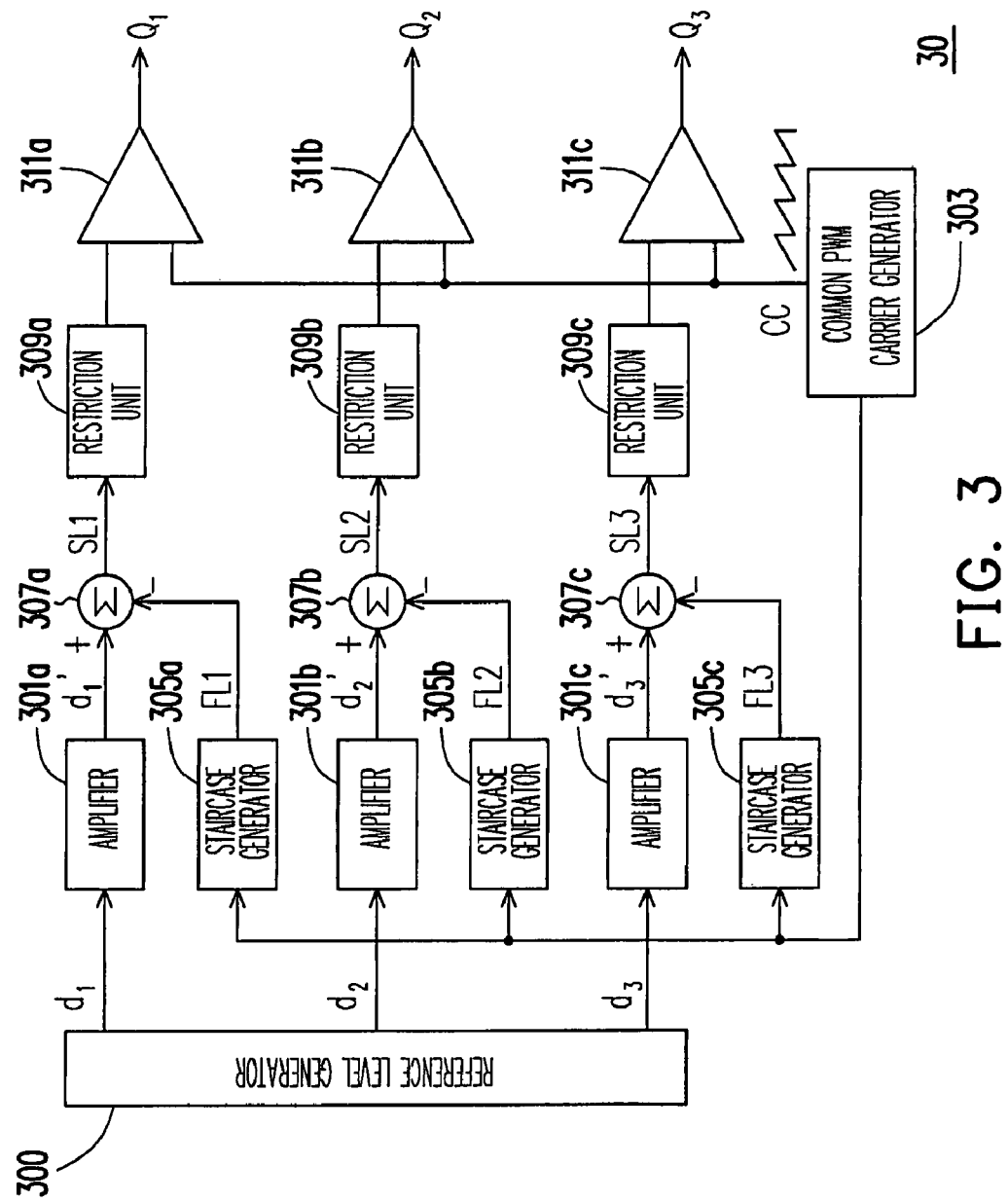
FIG. 3 is a block diagram of a digitized PWM signal generation apparatus according to an embodiment of the present invention.

FIG. 3 is a block diagram of a digitized PWM signal generation apparatus 30 according to an embodiment of the present invention. Referring to both FIG. 2 and FIG. 3, first, it is assumed that 3-phase PWM signals $Q_1 \sim Q_3$ are generated by foregoing digitized PWM signal generation method, namely, N=3, and the 3-phase PWM signals $Q_1 \sim Q_3$ have the same switch period ($T_{SW}$), and the phase difference between the PWM signals $Q_1 \sim Q_3$ is a third of the switch period ($T_{SW}/3$). With foregoing assumption, the digitized PWM signal generation apparatus 30 includes a reference level generator 300, three amplifiers 301a~301c, a common PWM carrier generator 303, three staircase generators 305a~305c, three calculation units 307a~307c, three restriction units 309a~309c, and three comparators 311a~311c.

Figure 4:
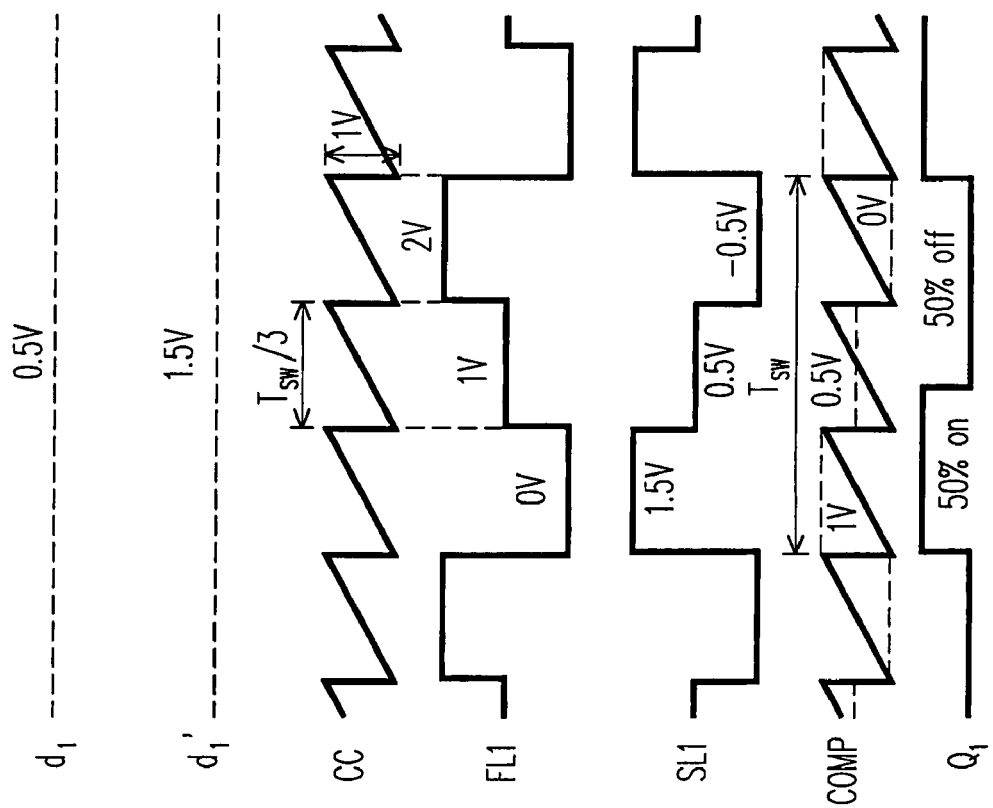
FIG. 4 illustrates a simulated procedure for generating a single-phase PWM signal.

The procedure for generating the PWM signal $Q_1$ will be first described in detail, and the procedures for generating the PWM signals $Q_2$ and $Q_3$ will be described later. FIG. 4 illustrates a simulated procedure for generating a single-phase PWM signal $Q_1$. Referring to FIGS. 2~4, first, the reference level generator 300 generates a reference level $d_1$, wherein the voltage value of the reference level $d_1$ is between 0V and 1V, and the value thereof determines the duty cycle of the PWM signal $Q_1$. In the present embodiment, the duty cycle of the PWM signal $Q_1$ is assumed to be 50 on and 50% off, and accordingly, the voltage value of the reference level $d_1$ is 0.5V.

Next, the amplifier 301a amplifies the voltage value of the reference level $d_1$ three times and then outputs the amplified reference level $d_1$ to the calculation input terminal (+) of the calculation unit 307a, namely, $d_1'=1.5V$ in FIG. 4. After that, the staircase generator 305a generates a 3-step digital staircase signals FL1 and sends it to the calculation input terminal (−) of the calculation unit 307a, wherein the third voltage level state of each step digital staircase signal FL1 is updated at a reset edge of each fixed-cycle sawtooth signal in a common PWM carrier CC generated by the common PWM carrier generator 303 according to the state of the PWM signal $Q_1$. In other words, as shown in FIG. 4, the third voltage level state of the first step digital staircase signal FL1 is 0V, the third voltage level state of the second step digital staircase signal FL1 is 1V, and the third voltage level state of the third step digital staircase signal FL1 is 2V.

Next, the calculation unit 307a subtracts the amplified reference level $d_1$ from the third voltage level of each step digital staircase signal FL1 to correspondingly obtain another 3-step digital staircase signals SL1, and then the calculation unit 307a outputs the 3-step digital staircase signals SL1 to the restriction unit 309a. In other words, as shown in FIG. 4, the fourth voltage level state of the first step digital staircase signal SL1 is 1.5V, the fourth voltage level state of the second step digital staircase signal SL1 is 0.5V, and the fourth voltage level state of the third step digital staircase signal SL1 is −0.5V.

Next, the restriction unit 309a restricts the fourth voltage level of each step digital staircase signal SL1 between 0V and 1V and outputs the restricted fourth voltage level of each step digital staircase signal SL1 to an input terminal of the comparator 311a. In other words, as shown in FIG. 4, the fourth voltage level of the first step digital staircase signal SL1 is restricted to 1V, the fourth voltage level of the second step digital staircase signal SL1 is not changed, and the fourth voltage level of the third step digital staircase signal is restricted to 0V. Then, the comparator 311a compares the fifth voltage of each fixed-cycle sawtooth signal in the common PWM carrier CC received from the other input terminal thereof with the restricted fourth voltage level of each step digital staircase signal SL1 (i.e. the comparison waveform COMP in FIG. 4) to output the PWM signal $Q_1$.

In the present embodiment, when the restricted fourth voltage level state of each step digital staircase signal SL1 is greater than the fifth voltage level of the fixed-cycle sawtooth signals, the PWM signal $Q_1$ is in an on state, and when the restricted fourth voltage level state of each step digital staircase signal SL1 is smaller than the fifth voltage level of the fixed-cycle sawtooth signals, the PWM signal $Q_1$ is in an off state. Here the ratio of the on state to the off state is the duty cycle of the PWM signal $Q_1$.

Additionally, in the present embodiment, the PWM signal $Q_1$ may also be in the on state when the restricted fourth voltage level state of each step digital staircase signal SL1 is smaller than the fifth voltage level of the fixed-cycle sawtooth signals and in the off state when the restricted fourth voltage level state of each step digital staircase signal SL1 is greater than the fifth voltage level of the fixed-cycle sawtooth signals according to the actual design requirement.

The procedure for generating the PWM signal $Q_1$ has been described clearly above, and for generating the PWM signals $Q_2$ and $Q_3$, the third voltage levels of the first step digital staircase signals FL2 and FL3 in the 3-step digital staircase signals FL2 and FL3 generated by the staircase generators 305b and 305c are respectively set to 2V and 1V, the third voltage levels of the second step digital staircase signals FL2 and FL3 in the 3-step digital staircase signals FL2 and FL3 generated by the staircase generators 305b and 305c are respectively set to 0V and 2V, and the third voltage levels of the third step digital staircase signals FL2 and FL3 in the 3-step digital staircase signals FL2 and FL3 generated by the staircase generators 305b and 305c are respectively set to 1V and 0V. Thus, if the voltage values of the reference levels $d_2$ and $d_3$ generated by the reference level generator 300 are also 0.5V, the PWM signals $Q_1$~$Q_3$ respectively generated by the comparators 311a~311c are the same as the PWM signals (d)~(f) illustrated in FIG. 1.

However, the spirit of the present invention is not limited to the procedures for generating the 3-phase PWM signals described above. In other words, the method for generating PWM signals more than three phases should be understood by those having ordinary knowledge in the art based on the present disclosure, therefore will not be described herein.

In addition, the voltage value of the reference levels $d_1$~$d_3$ is 0.5V only when the duty cycles of the PWM signals $Q_1$~$Q_3$ are 50% on and 50% off; however, the present invention is not limited thereto. In other words, if the duty cycles of the PWM signals $Q_1$~$Q_3$ are all 100% on, the fully on duty cycles can be achieved by setting the voltage value of the reference levels $d_1$~$d_3$ to 1V, and if the duty cycles of the PWM signals $Q_1$~$Q_3$ are all 0% on, the fully off duty cycles can be achieved by setting the voltage value of the reference levels $d_1$~$d_3$ to 0V. Thus, the digitized PWM signal generation method in the present embodiment is not limited to the number of split phases of the PWM signals, and accordingly won't affect the duty cycles of the PWM signals $Q_1$~$Q_3$~

Moreover, the digitized PWM signal generation method in the present embodiment can be used for driving a plurality of buck converters connected to each other in parallel so as to provided a core voltage ($V_{DD\_CORE}$) required by the central processing unit (CPU). When the CPU is in a lightly-loaded operation state, the phase difference between the PWM signals $Q_1$~$Q_3$ is a third of the switch period $T_{SW}$ ($T_{SW}/3$), namely, the buck converters connected to each other in parallel is turned on one by one. When the CPU is in a heavily-loaded operation state, the phase difference between the PWM signals $Q_1$~$Q_3$ is 0, namely, the states of the 3-step digital staircase signals FL1, FL2, and FL3 are all the same so that the buck converters connected to each other in parallel can be turned on at the same time.

In summary, the digitized PWM signal generation method provided by the present invention has at least following advantages:
1. The duty cycle of each phase PWM signal is not restricted by the number of split phases of the PWM signals, and fully on duty cycle or fully off duty cycle can be easily achieved.
2. The method provided by the present invention can be applied to any application apparatus having boost/buck converter according to the actual design requirement.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A digitized pulse width modulation (PWM) signal generation method for generating N-phase PWM signals, wherein each phase PWM signal has a same period, and a phase difference between the PWM signals is said period being divided by N or is 0, wherein N is a positive integer greater than or equal to 3, the digitized PWM signal generation method comprising:

providing a plurality of reference levels, wherein a voltage value of each reference level is between a first voltage value and a second voltage value, and the reference levels are used for determining a duty cycle of the PWM signals correspondingly;

providing a common PWM carrier, wherein the common PWM carrier is a plurality of fixed-cycle sawtooth signals, and the common PWM carrier has N fixed-cycle sawtooth signals during the switch period of each phase PWM signal;

providing a plurality of first (N−1)-step digital staircase signals, wherein a third voltage level state of each step digital staircase in each of the first (N−1)-step digital staircase signals is updated at a reset edge of each fixed-cycle sawtooth signal according to the state of each phase PWM signal;

amplifying the reference levels N times, and then subtracting the amplified reference levels from the third voltage level of each step digital staircase in each of the first (N−1)-step digital staircase signals to obtain a plurality of second (N−1)-step digital staircase signals correspondingly;

restricting a fourth voltage level state of each step digital staircase in each of the second (N−1)-step digital staircase signals between the first voltage value and the second voltage value; and comparing the restricted fourth voltage level state of each step digital staircase in each of the second (N−1)-step digital staircase signals with a fifth voltage level of the fixed-cycle sawtooth signals during the switch period of each phase PWM signal to generate the N-phase PWM signals correspondingly.

2. The digitized PWM signal generation method according to claim 1, wherein when the restricted fourth voltage level state of each step digital staircase in each of the second (N−1)-step digital staircase signals is greater than the fifth voltage level of the fixed-cycle sawtooth signals, the N-phase PWM signals are in an on state, and when the restricted fourth voltage level state of each step digital staircase in each of the second (N−1)-step digital staircase signals is smaller than the fifth voltage level of the fixed-cycle sawtooth signals, the N-phase PWM signals are in an off state, and a ratio of the on state to the off state is the duty cycle of each phase PWM signal.

3. The digitized PWM signal generation method according to claim 1, wherein when the restricted fourth voltage level state of each step digital staircase in each of the second (N−1)-step digital staircase signals is greater than the fifth voltage level of the fixed-cycle sawtooth signals, the N-phase PWM signals are in an off state, and when the restricted fourth voltage level state of each step digital staircase in each of the second (N−1)-step digital staircase signals is smaller than the fifth voltage level of the fixed-cycle sawtooth signals, the N-phase PWM signals are in an on state, and a ratio of the on state to the off state is the duty cycle of each phase PWM signal.

4. The digitized PWM signal generation method according to claim 1, wherein each of the fixed-cycle sawtooth signals is a leading-edge sawtooth signal or a post-edge sawtooth signal.

5. The digitized PWM signal generation method according to claim 1, wherein the phase difference between the PWM signals is 0 when the first (N−1)-step digital staircase signals are all the same, otherwise, the phase difference between the PWM signals is the number of the switch period being divided by N.

* * * * *